United States Patent [19]
Wu

[11] Patent Number: 5,811,799
[45] Date of Patent: Sep. 22, 1998

[54] IMAGE SENSOR PACKAGE HAVING A WALL WITH A SEALED COVER

[76] Inventor: Liang-Chung Wu, No. 13, Lane 16, Alley 697, Ming-Hu Road, Hsin-Chu, Taiwan

[21] Appl. No.: 904,033

[22] Filed: Jul. 31, 1997

[51] Int. Cl.⁶ ....................................................... H01J 5/02
[52] U.S. Cl. .......................................... 250/239; 257/433
[58] Field of Search ................................ 250/239, 214.1, 250/208.1; 257/80–84, 432, 433

[56] References Cited

U.S. PATENT DOCUMENTS 5,289,002  2/1994  Tarn ........................................ 250/239

Primary Examiner—Que Le
Attorney, Agent, or Firm—H. C. Lin

[57] ABSTRACT

An image sensor chip is mounted on a printed wiring frame over a substrate, which is plated with a spider web of plated conductors connecting the IC through via holes to the bottom of the substrate as output terminals. After wiring bonding the IC to the plated conductor, the package is sealed. A wall is erected around the image sensor chip and is covered with a transparent glass. A lens may be placed in the middle of the cover for focusing. The structure is amenable to mass production. A large number of printed wiring frames are arranged as a matrix on a common substrate. The frames are sealed column by column or sealed all at once. After sealing, the common substrate are diced into individual packages. The image sensor package may mounted with integrated circuit chips as peripheral circuits. The image sensor chips may be sealed with transparent glue and the integrated circuit chip may be sealed with opaque glue.

16 Claims, 13 Drawing Sheets

IMAGE SENSOR PACKAGE HAVING A WALL WITH A SEALED COVER

This is a co-pending application of U.S. patent application Ser. No. 08/902,223, filed Jun. 29, 1997.

INTRODUCTION

This invention relates to integrated circuit (IC) package, in particular, package for image sensors.

Image sensors include charge coupled device sensors and complementary metal-oxide-semiconductor sensors. In conventional packaging of these devices, the image sensor is mounted on a ceramic substrate with protruding pins. After wire-bonding and window sealing, the pins are cut to proper length to complete the packaging process.

FIG. 1 shows the basic ceramic base 99 of a conventional package. A ceramic substrate 16 is mounted with a ceramic frame 15 through ceramic glass 17. The ceramic glass is imbedded with pins 14. After assembling, the structure is heated at high temperature to melt the ceramic glass 17, the ceramic frame 15, the conductor pins 14 and the substrate 16 into a unitary structure 99.

FIG. 2 shows how an image sensor 50 is mounted on the ceramic base 99. The image sensor 50 is placed over the middle of the substrate 16 and glued to the substrate with silver epoxy 502. Bonding wires 504 are used to connect the output pads of the image sensor to the conductor pins 14. Then a transparent glass cover is glued to the frame 99 with sealing compound 19. After high temperature heat treatment, the structure is solidified, and the pins 14 are cut to proper length using a high precision cutting machine. FIG. 3 shows a completed package.

Such a packaging technique requires special ceramic material and high precision machinery. The biggest drawback of such a package is that every different shape of frames requires a dedicated mold for sealing the package. If the number of pins are different, the mold must be different. Another shortcoming is that the protruded pins are easily damaged by external force. Furthermore, when the number of pins is increased, the degree of difficulty in manufacturing is increased rapidly.

Still another shortcoming of the conventional technique is the sealing process. Whenever the specification of the product is changed, a new mold for the seal must provided to properly seal the package.

SUMMARY

The first object of the present invention is to develop an image sensor package which is simple to manufacture and low in cost.

A second object of this invention is to develop an image package which is suitable for mass production.

A third object of this invention is to develop an image sensor package which is suitable to be incorporated as a multiple-chip package having other peripheral integrated circuit chips.

A fourth object of this invention is to develop an image sensor package as a multiple-chip package suitable for mass production.

A fifth object of this invention is to develop an image sensor package which incorporates a lens.

These objects are achieved in this invention by using a printed wiring frame, in which a substrate is plated with a spider web of conductors. The inner end of the conductor is connected to a bonding pad of the image sensor chip, and the outer end is connected to a via hole which is connected to the bottom of the substrate for external connection, thus avoiding any protruding pins.

The image sensor chip is surrounded with a wall over which a transparent glass or a flat plate with a lens covers.

The structure is amenable to mass production. A large number of these printed frames are arranged as a matrix on a common substrate. These frames can either be sealed column by column or all at once. The common substrate are then diced as individual packages, thus avoiding the expense of individually sealing the packages.

DETAILED DESCRIPTION OF THE PREFERRED EMBODIMENT

Figure 1:
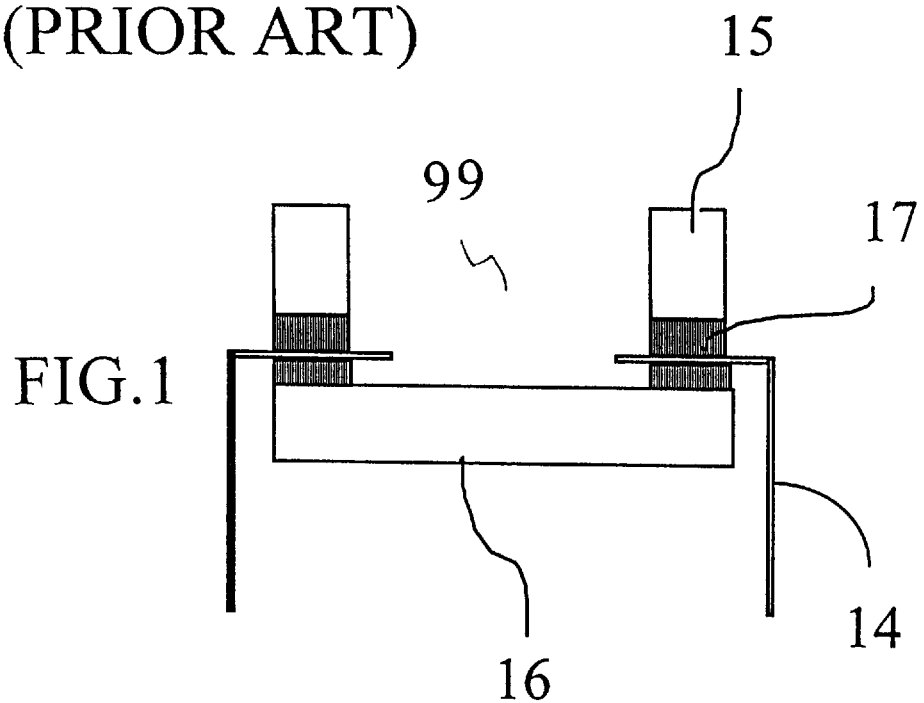
FIG. 1 shows the frame of a package for mounting an image sensor chip.
Figure 2:
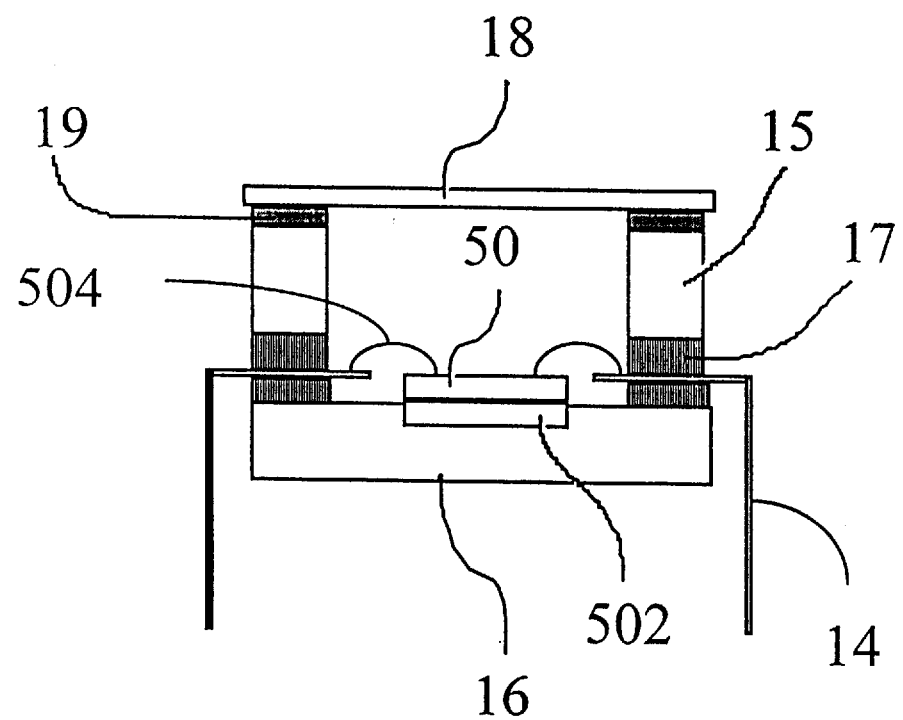
FIG. 2 shows the dual in-line package with a cut-away view of the mounted image sensor chip.
Figure 3:
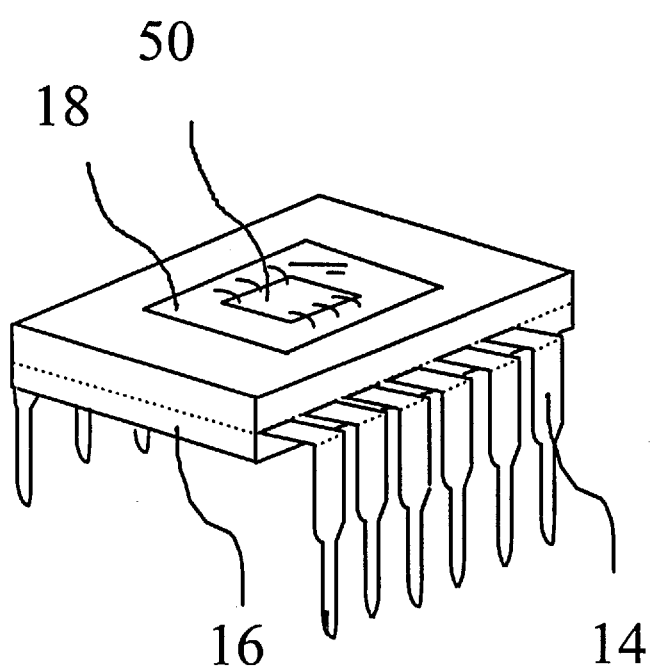
FIG. 3 shows the a flat pack of rectangular shape.
Figure 4A:
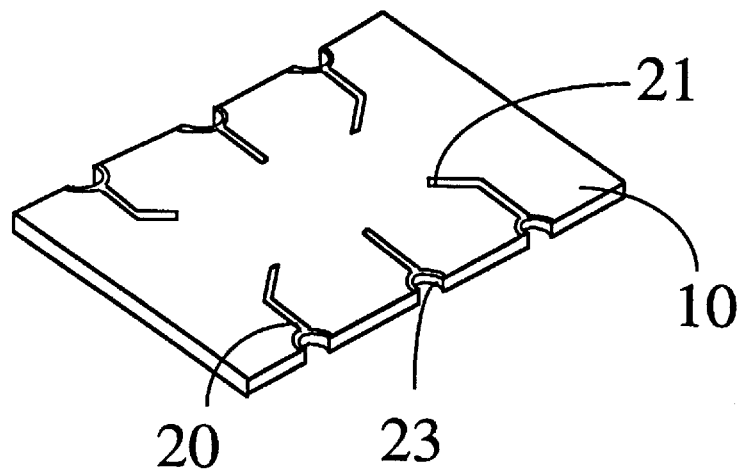
FIG. 4A shows the printed wiring frame of the present invention.
Figure 4B:
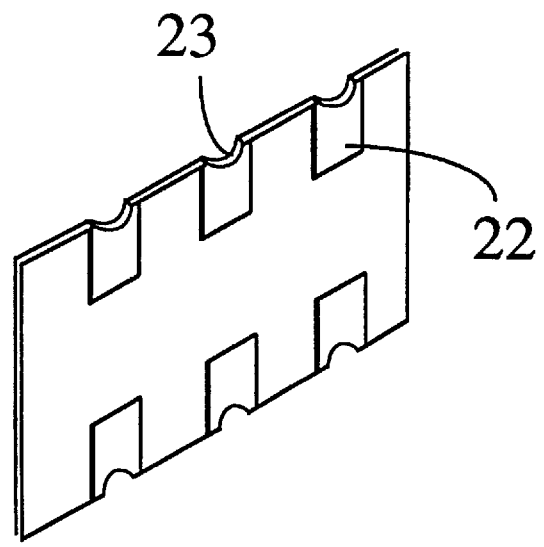
FIG. 4B shows the terminal pad connected to the via hole at the bottom of the substrate.

FIG. 4 shows a printed circuit interconnection frame of the present invention. A number of printed conductors 20 are plated on an insulating substrate 10. Each plated conductor forms an independent conductor 20. The inner ends 21 of the conductor are used to connect the output terminals of an image sensor chip. The outer ends of the conductor 20 is connected to a plated via hole 23, which, in turn, is connected to the bottom side of the substrate 10.

Figure 5A:
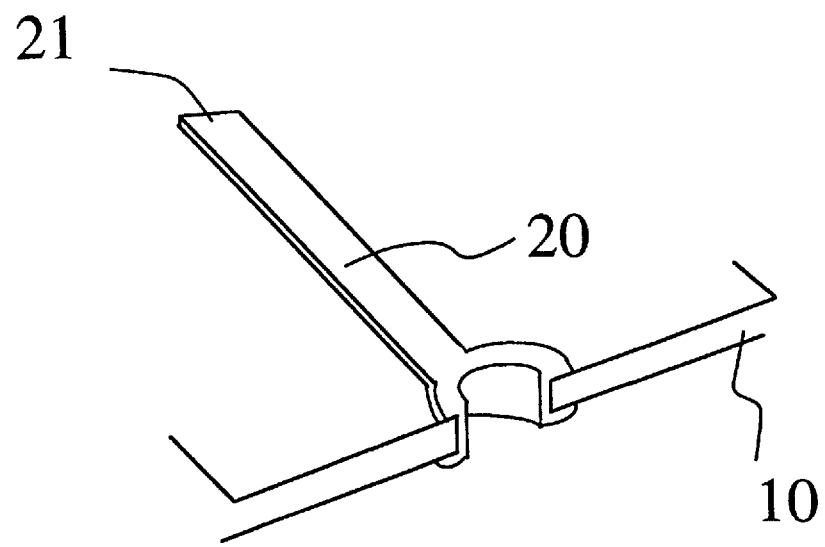
FIG. 5A shows the via hole at the edge of the printed wiring frame.
Figure 5B:
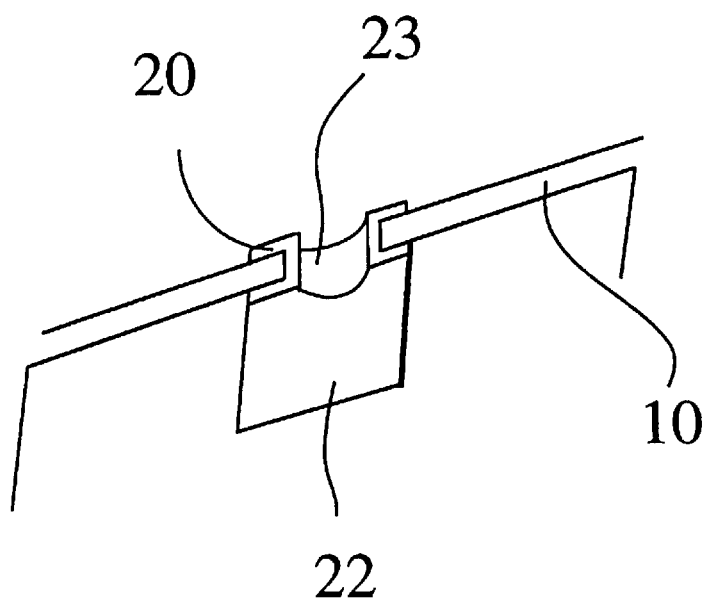
FIG. 5B shows a terminal pad folded as he end of the via hole at the bottom of the substrate.

FIG. 5a shows an enlarged view of the conductor 20. The inner end of the conductor is used to connect to an output terminal of an image sensor chip. The output end of the conductor 20 wraps over the via hole as shown in FIG. 5b and forms a pad 22 at the bottom side of the substrate 10, which constitutes the output terminal of the image sensor chip 50.

Figure 6A:
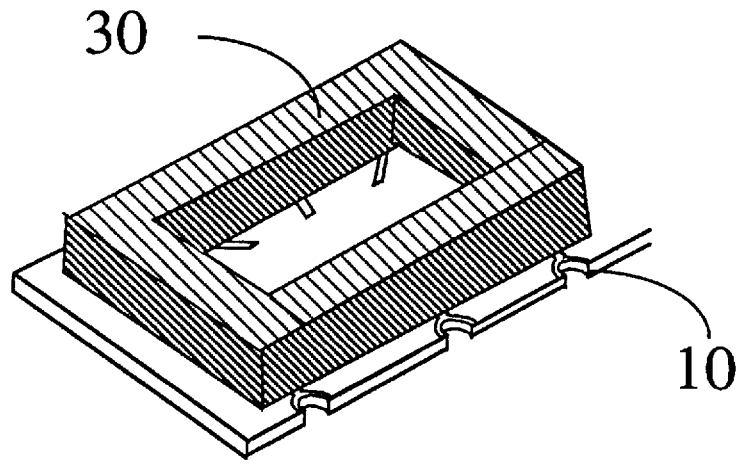
FIG. 6A show a wall erected on the printed wiring frame.
Figure 6B:
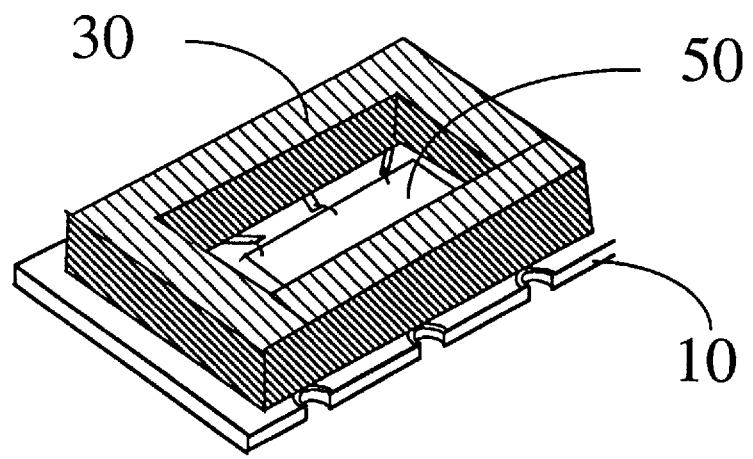
FIG. 6B shows the wall surrounding the image sensor chip.
Figure 6C:
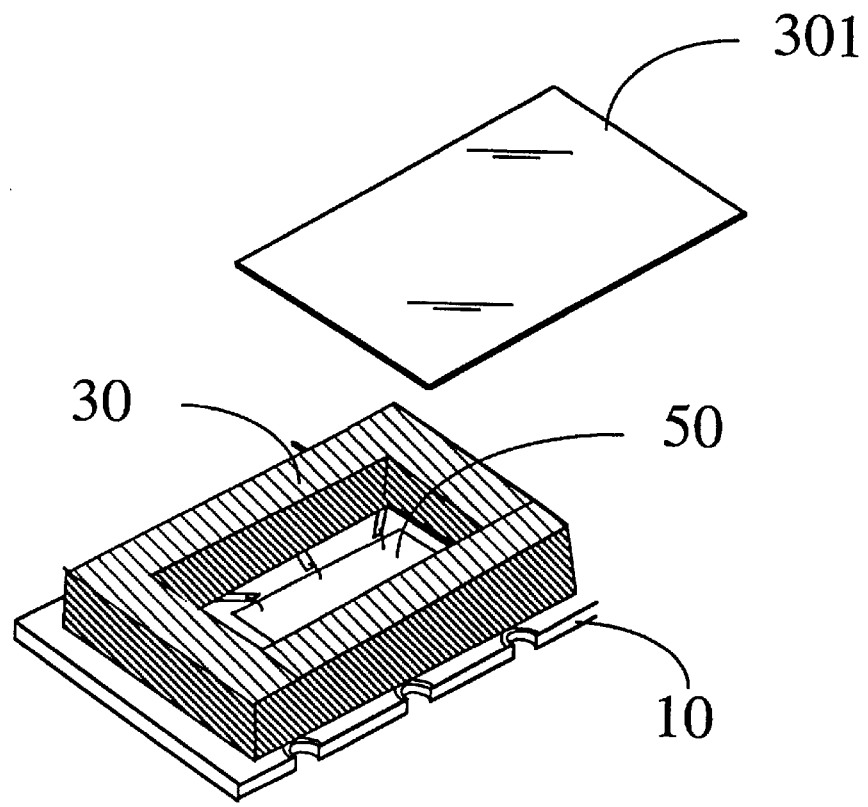
FIG. 6C shows a transparent cover for the wall.
Figure 6D:
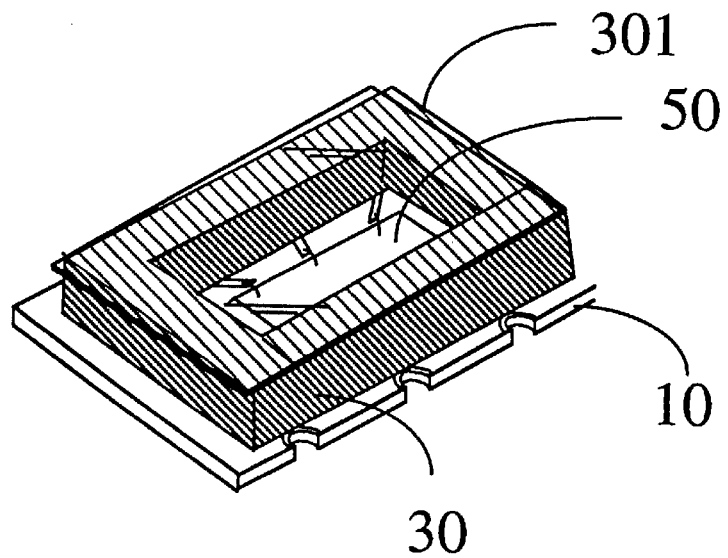
FIG. 6D shows the cover sealed to the wall.
Figure 6E:
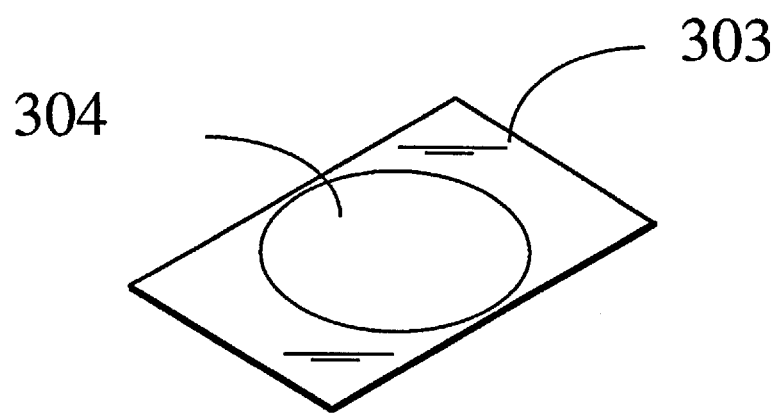
FIG. 6E shows a cover with a lens.

FIG. 6A shows a feature of the present invention. A wall 30 is placed over the printed wiring frame 10. The image sensor chip 50 is placed in the middle of the wall and is wire bonded to the printed wiring frame 10 as shown in FIG. 6B. A transparent glass or transparent plastic cover 301 is glued to the top of the wall as shown in FIG. 6C. An assembled image sensor package is shown in FIG. 6D. In addition, a cover 303 with a lens 304 may be used in place of the cover 301 as shown in FIG. 6E. With the lens 304, there is no need to use an external lens, thus saving space.

A feature of the present structure is that the external connection to the image sensor chip 50 is through the pad 22 at the bottom of the substrate. The biggest difference of the present invention is the elimination of the "lead frame" used in a conventional IC package. Instead, this invention uses a "printed wiring frame". The package of the present invention does not have any pins protruding out from the package.

The present invention may use an image sensor chip with output pads facing upward, which are then wire bonded to the conductor 20. The image sensor chip 50 may also be soldered directly to the end 21 of the conductor 20, thus eliminating the wire-bonding step.

The bottom of the image sensor chip 50 can be mounted on a heat dissipating pad to reduce the temperature of the IC chip. This pad may also be used as an electrical terminal of the IC.

Figure 7:
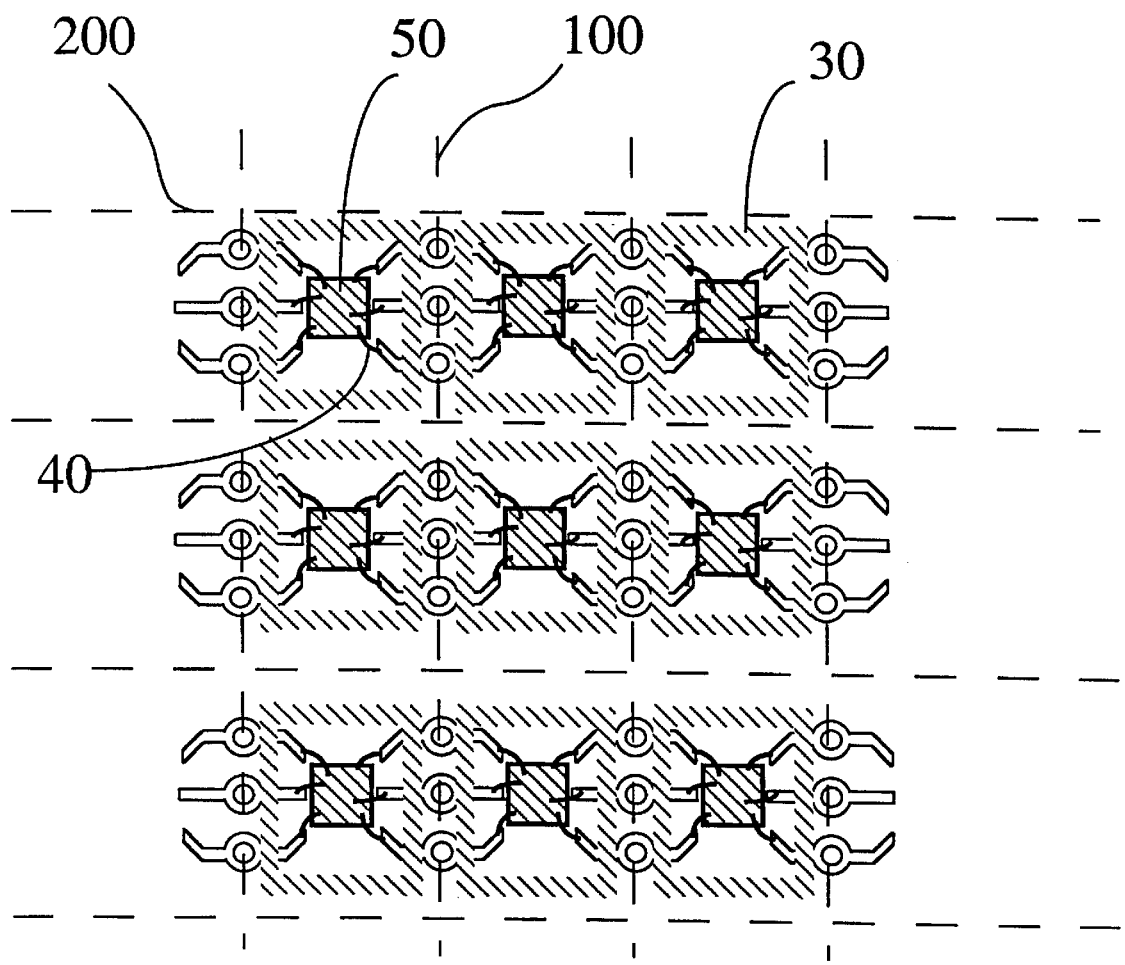
FIG. 7 shows a matrix of printed wiring frames batch processed for mass production.

FIG. 7 shows the mass production technique for the present invention. A large number of printed wiring frame 300 units are printed on a common substrate, and the substrate is later diced along the horizontal lines 200 and vertical lines 100 to form individual units. The wall 30, shown in section lines, is sealed to the printed wiring frame around the image sensor chip 50, which is connected to the plated conductor through bonding wires 40. Finally, a common cover (not shown) is glued over the walls 30.

This invention allows sealing the image sensors in a batch process instead of each individual sealing, thus greatly reducing the cost of packaging and enhancing the speed of mass production.

Figure 8A:
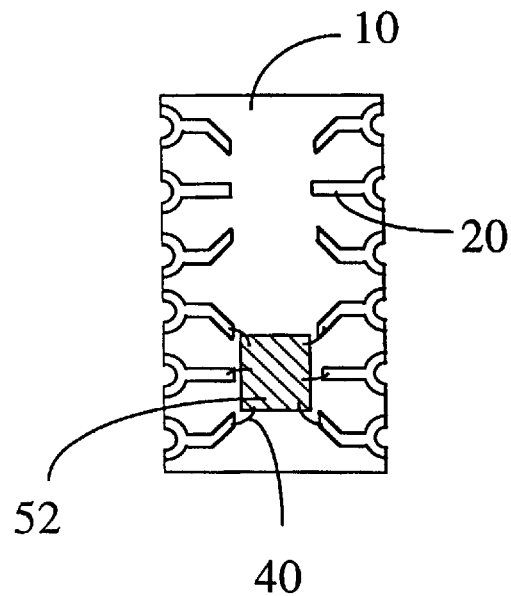
FIG. 8A shows an integrated circuit chip is first mounted on a printed wiring frame in a multiple-chip package.
Figure 8B:
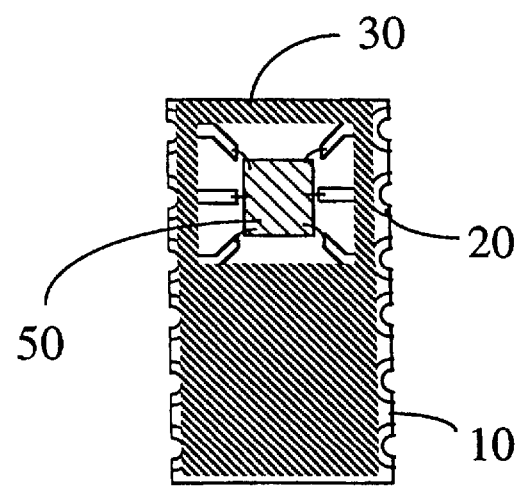
FIG. 8B shows an image sensor chip is then mounted after the integrated circuit chip.

For multiple-chip packaging in which an integrated circuit chip is packaged with an image sensor chip, the integrated circuit chip 52 is first mounted and wire-bonded with wire 40 to the plated conductor of the printed wiring frame 10. The integrated circuit chip is then covered with opaque glue 30 which also serves a wall, and the image sensor chip 50 is mounted as shown in FIG. 8B. After wire bonding, a pre-glued glass cover (not shown) is glued on top of the structure. After baking, a multiple-chip image sensor package is yielded.

Figure 8C:
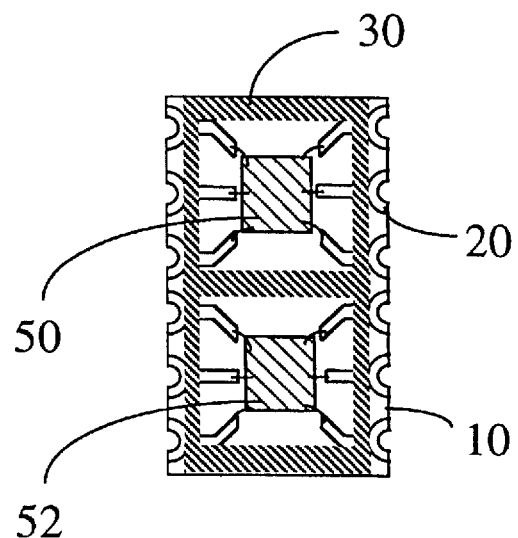
FIG. 8C shows a image sensor chip and an integrated circuit chip separated by a wall.
Figure 8D:
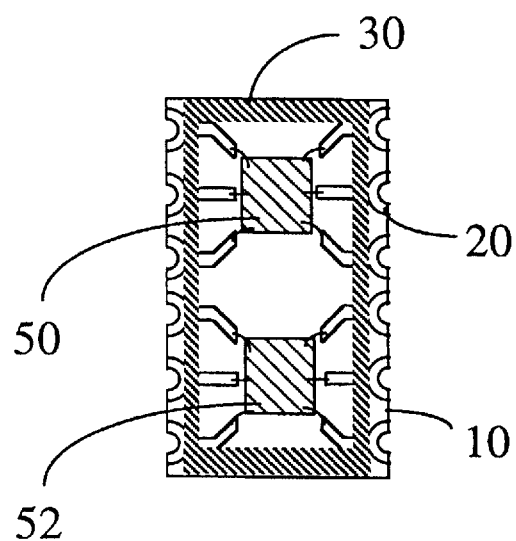
FIG. 8D shows an image sensor chip and an integrated circuit chip sharing the same wall.

Alternatively, FIGS. 8C and D show other structures for the multiple-chip package. The walls 30 may be erected before the image sensor chip 50 and the IC chip are mounted. The package is later covered with a window having transparent area over the image sensor chip and opaque area over the integrated circuit chip. Alternatively, the package is first covered with a common transparent window, and the transparent area over the integrated circuit is later made opaque after assembly, leaving the area over the image sensor transparent.

Figure 9A:
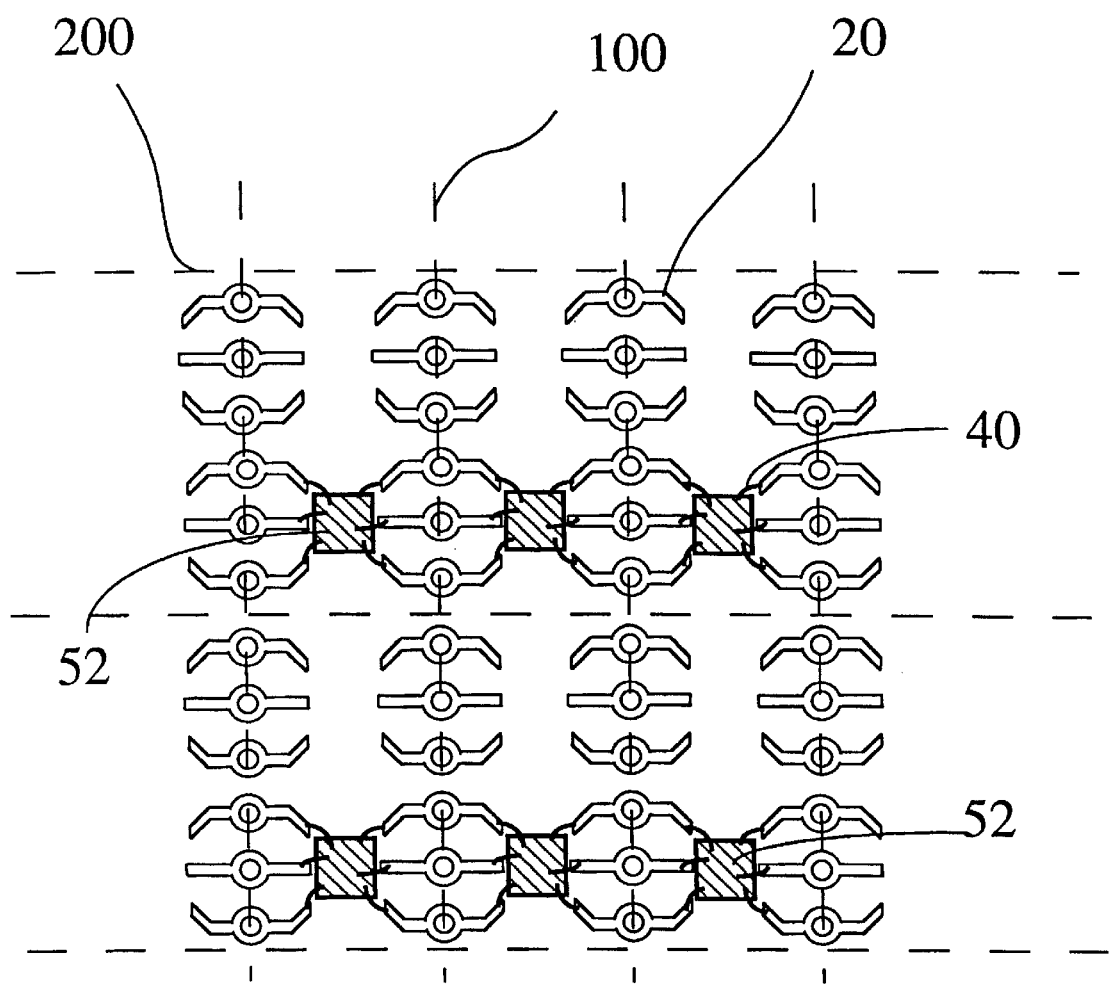
FIG. 9A shows a matrix of printed wiring frames each mounted and wire bonded with an image sensor chip and an integrated circuit chip.
Figure 9B:
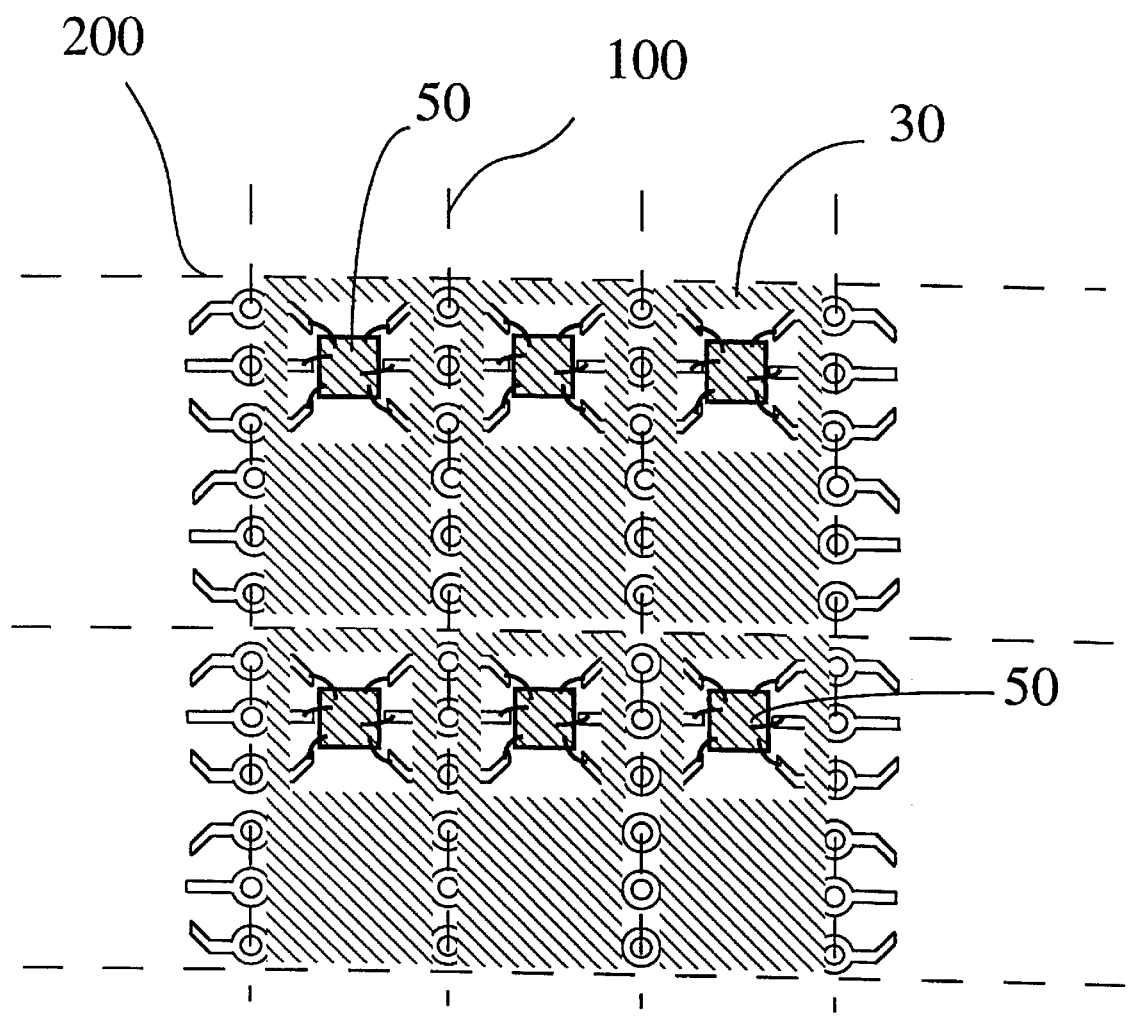
FIG. 9B shows the die in FIG. 9A covered with opaque glue over the integrated circuit chips.

FIG. 9A shows a mass production technique for the multiple-chip image sensor packages. The IC chips 52 are first mounted on the printed wiring frames. FIG. 9B shows that these IC chips are sealed with glue 30. Then, the image sensor chips 50 are mounted and wire-bonded. Finally, a pre-glued cover is glued over the wall 30. After curing, the substrate is diced along horizontal lines 200 and vertical lines 100 to yield a large number of packages. The connection between the image sensor and the IC can be connected with wire-bonding or with external connection through the plated conductors 20. If there are more than one IC for each image sensor, the interconnection can be made in a similar fashion. The connection of the IC with plated conductors can be made with wire bonding or solder balls.

Figure 10A:
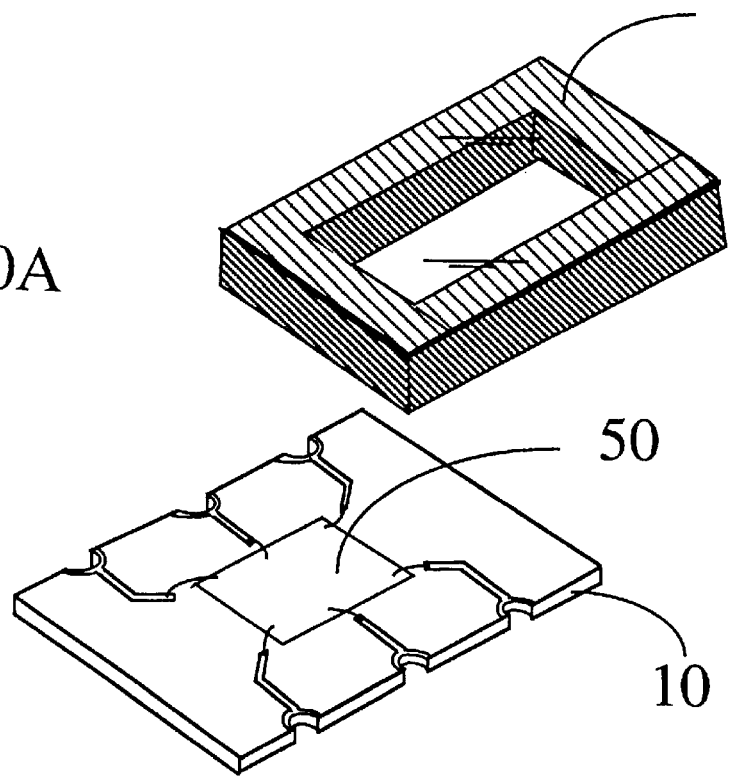
FIG. 10A shows the transparent cover for the image sensor package.
Figure 10B:
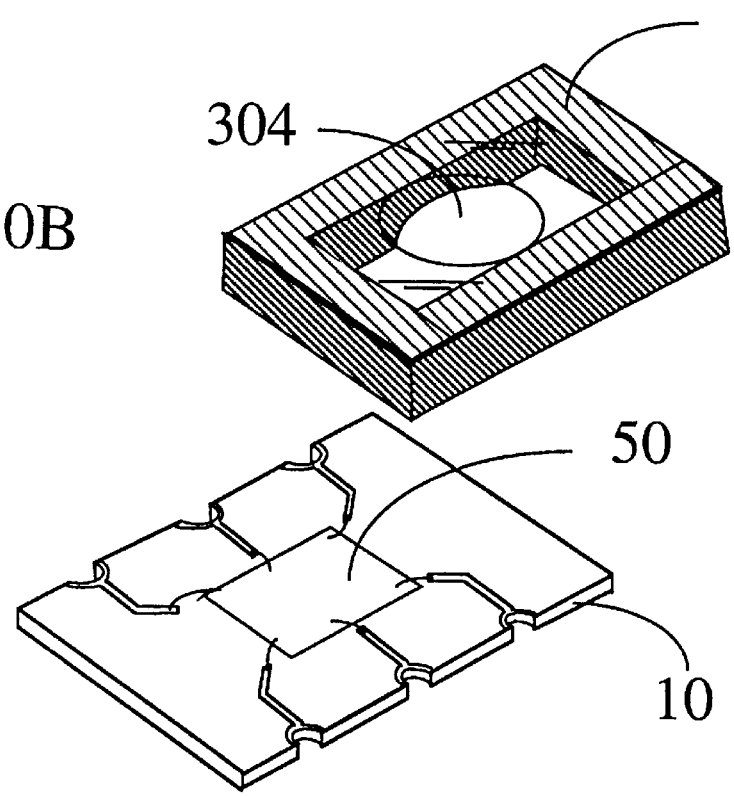
FIG. 10B shows a cover with a lens.

FIG. 10A shows a pre-molded wall 302 placed over the printed-wiring frame 10 mounted with an image sensor chip 50. FIG. 10B shows a cover 303 with a lens 304 mounted over the wall shown in FIG. 10A. In both FIG. 10A and FIG. 10B, the wall and the cover can be mounted as an integrated unit.

Multiple-layered boards can have more interconnection possibilities. Thus if the substrate 10 is made of a multiple-layered board, the terminal positions of the IC can be changed. For instance, if the first output of the IC chip 50 is connected to first terminal of the printed wiring frame. By using a multiple-layered board, the first terminal can be changed to be the second terminal. Thus the image sensor chip need not change the layout and yet achieve more leeway in design.

The foregoing descriptions are merely examples of the preferred embodiment. The invention is by no mean limited to these examples. Any equivalent techniques to implement image sensor package are all within the scope of this invention.

What is claimed is:

1. An image sensor package, comprising:
   an image sensor chip with multiple output terminals;
   a printed wiring frame having at least one conductor thereon,
      said conductor having one end coupled to one of said output terminals, and said conductor having a second end extending to the bottom of said printed wiring frame;
   a wall erected around said image sensor chip with a height taller than the height of the image sensor chip; and
   a transparent cover sealed over the top of said wall.

2. An image sensor package as described in claim 1, wherein said transparent cover is made of glass.

3. An image sensor package as described in claim 1, wherein said transparent cover is made of plastic.

4. An image sensor package as described in claim 1, wherein said transparent cover has a lens in the middle of the transparent cover for focusing an image on said image sensor chip.

5. An image sensor package as described in claim 1, wherein said image sensor chip is connected with at least one more integrated circuit chip within said package.

6. An image sensor package as described in claim 5, wherein said integrated circuit chip is covered with opaque seal.

7. An image sensor package as described in claim 6, wherein said wall and said seal are integrated as one component.

8. An image sensor package as described in claim 6, wherein said opaque seal is made of the same material as said wall.

9. An image sensor package as described in claim 5, wherein said integrated circuit chip is surrounded with a wall similar to that surrounding said image sensor chip.

10. An image sensor package as described in claim 5, wherein said image sensor chip and said integrated circuit chip are surrounded by a common wall.

11. An image sensor package as described in claim 1, wherein said image sensor is a charge coupled device.

12. An image sensor package as described in claim 1, wherein said image sensor is a complementary MOS sensor.

13. A method of mass producing a multiplicity of image sensor packages on a common substrate, each having:
an image sensor chip with multiple output terminals,
a printed wiring frame having at least one conductor thereon,
said conductor having a first end coupled to one of said output terminals, and a second extending to the bottom of said printed wiring frame;
a wall erected around said image sensor chip with a height taller than the height of said image sensor chip, and
a transparent cover sealed over said wall, comprising the steps of:
printing a large number of said printed wiring frame on said common substrate as a matrix,
applying glue around each said image sensor chip to erect said wall,
sealing said wall with a common said transparent cover, and
dicing said common substrate into said number of said image sensor packages.

14. A method of mass producing a multiplicity of image sensor packages as described in claim 13, wherein said image sensor chip is connected to at least one more integrated chip mounted in the same package.

15. A method of mass producing a multiplicity of image sensor packages as described in claim 14, wherein said integrated circuit chip is covered with opaque seal.

16. A method of mass producing a multiplicity of image sensor packages as described in claim 15, wherein said opaque seal is made of the same material as said wall.

* * * * *